(12) United States Patent
Sentoku et al.

(10) Patent No.: US 7,952,725 B2
(45) Date of Patent: May 31, 2011

(54) SURFACE SHAPE MEASUREMENT APPARATUS AND EXPOSURE APPARATUS

(75) Inventors: Koichi Sentoku, Kawachi-gun (JP);
Takahiro Matsumoto, Utsunomiya (JP);
Satoru Oishi, Utsunomiya (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 199 days.

(21) Appl. No.: 12/465,567

(22) Filed: May 13, 2009

(65) Prior Publication Data

US 2009/0286172 A1    Nov. 19, 2009

(30) Foreign Application Priority Data

May 16, 2008 (JP) ................................. 2008-129231

(51) Int. Cl.
*G01B 11/02* (2006.01)
(52) U.S. Cl. ...................................................... 356/512
(58) Field of Classification Search .................. 356/485, 356/489, 495, 511, 512
See application file for complete search history.

(56) References Cited

U.S. PATENT DOCUMENTS

| | | | | |
|---|---|---|---|---|
| 4,606,638 A | * | 8/1986 | Sommargren | 356/492 |
| 4,861,162 A | | 8/1989 | Ina | |
| 6,002,480 A | * | 12/1999 | Izatt et al. | 356/479 |
| 6,501,553 B1 | * | 12/2002 | Ogawa et al. | 356/512 |

FOREIGN PATENT DOCUMENTS

JP    06-260391 A    9/1994

OTHER PUBLICATIONS

Singal Processing for Wavelength Scanning Interferometer; Chin-Che Kuo et al.; vol. 69, No. 6, p. 831.

* cited by examiner

*Primary Examiner* — Tarifur Chowdhury
*Assistant Examiner* — Jonathon D. Cook
(74) *Attorney, Agent, or Firm* — Canon USA, Inc. IP Division

(57) ABSTRACT

A surface shape measurement apparatus is configured to measure a surface shape of an object to be measured, and includes a beam splitter configured to split white light from a light source into two light beams, a pair of prisms each configured to increase an incident angle of each light beam that has been split by the beam splitter and directed to the object or a reference surface, each prism having an antireflection part that is formed at a period of a wavelength of the white light or smaller and has a moth-eye shape, a superimposition unit configured to superimpose object light from the object with reference light from the reference surface and has passed the second prism, and to generate white interference light, and a Lyot filter configured to discretely separate the white interference light for each of a plurality of wavelengths.

8 Claims, 7 Drawing Sheets

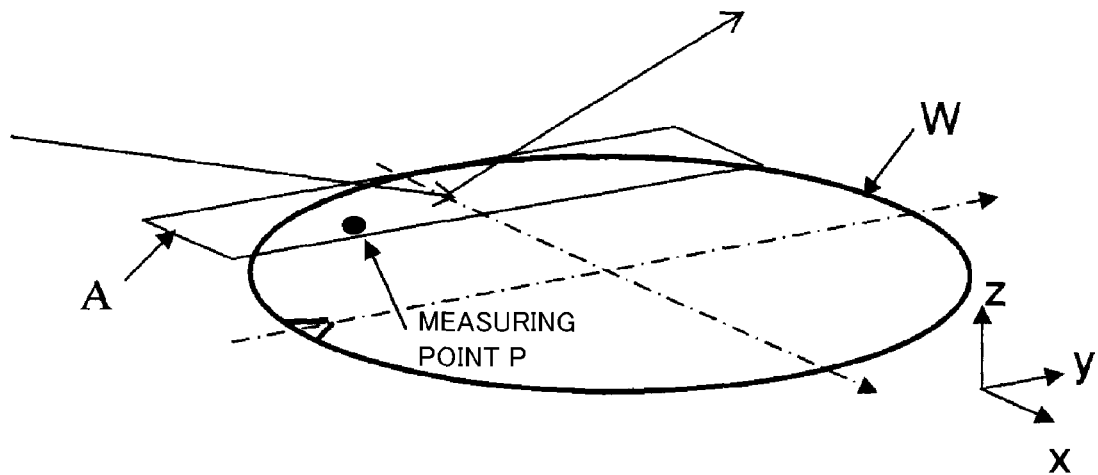
FIG. 3
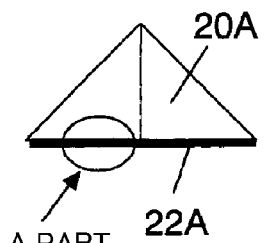
FIG. 4A
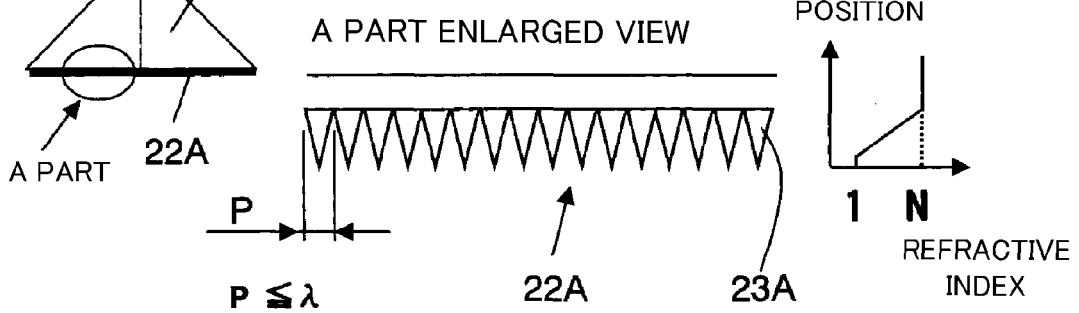
FIG. 4B
FIG. 4C
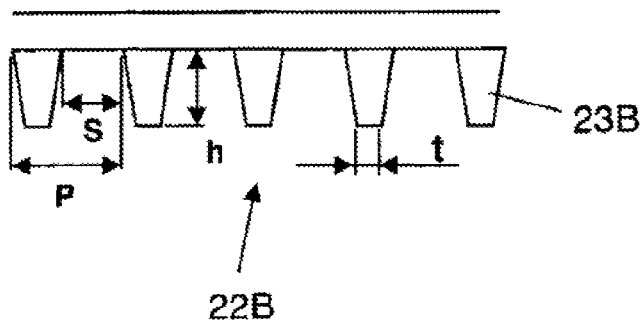
FIG. 4D

PRIOR ART
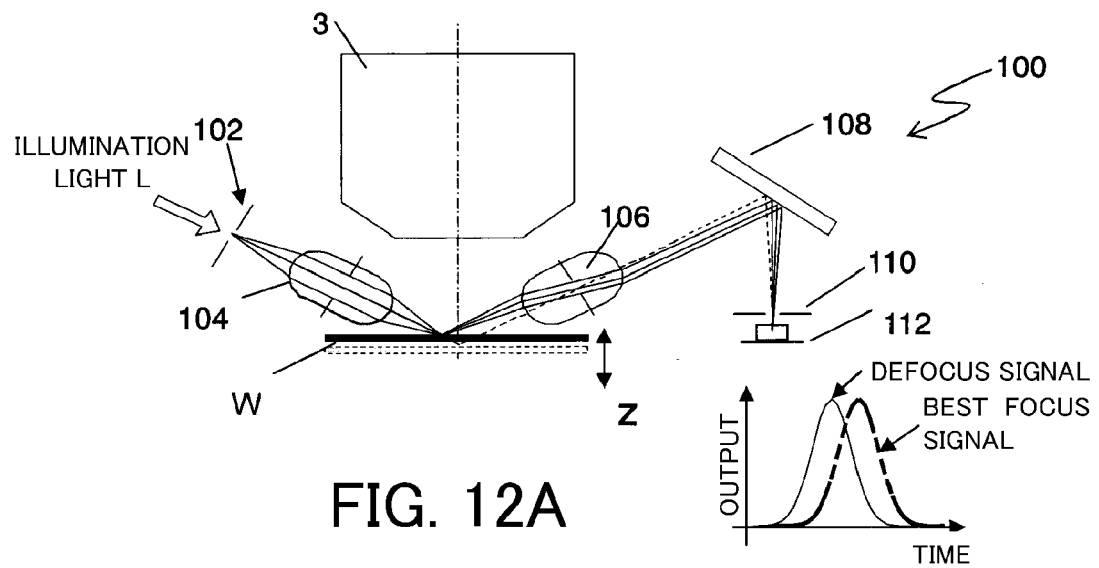
FIG. 12A
FIG. 12B
PRIOR ART
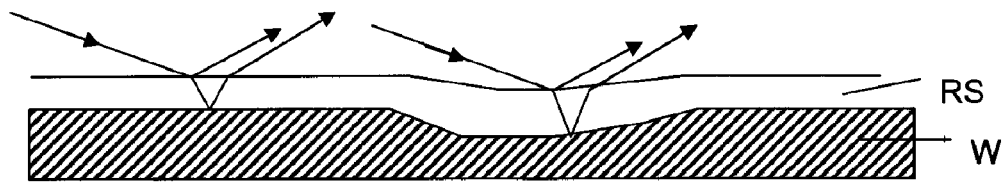
FIG. 13

SURFACE SHAPE MEASUREMENT APPARATUS AND EXPOSURE APPARATUS

BACKGROUND OF THE INVENTION

1. Field of the Invention

The present invention relates to a surface shape measurement apparatus and an exposure apparatus.

2. Description of the Related Art

There is conventionally known a scanning exposure apparatus configured to expose an original's pattern onto a substrate via a projection optical system using a step-and-scan manner that synchronously scans the original and the substrate. See, for example, U.S. Pat. No. 4,861,162. Since it is necessary for the scanning exposure apparatus to focus the substrate surface onto an image surface position of the projection optical system on a real time basis during the exposure, a surface position (height) and tilt of the substrate are measured by using obliquely incident light before a position to be exposed reaches an exposure slit as a scan area. See, for example, Japanese Patent Laid-Open No. 06-260391.

A method for separates white interference light that contains information of the substrate's surface shape into a plurality of interference light beams each having a single wavelength, for photoelectrically converting the interference light beams, for performing a fast Fourier transformation ("FFT") for the obtained plurality of interference signals, and for obtaining the substrate's surface shape is applicable to the measurement of the surface shape of the substrate. The measurement principle is disclosed in Chih-Che KUO, et al., "Signal Processing for Wavelength Scanning Interferometer," Journal of the Japan Society for Precision Engineering, Vol. 69, No. 6, 2003, p. 831. As a method for separating the white interference light into a plurality of interference light beams each having a single wavelength, there are known a method for preparing a plurality of glass filters having different wavelength transmission characteristics and for changing the combination, and a method for making variable a wavelength of a laser as a light source.

Due to the recent demand for a high resolution, focus and tilt measurements require a high precision, and the conventional measurement method that utilizes the obliquely incident light cannot obtain the given measurement precision due to the influence of a peripheral pattern on the substrate and uneven thickness of the resist. A problem caused by a longitudinal structure of the substrate can be solved by setting an incident angle upon the substrate to 80° or larger, but the optical system become complex, large, and vulnerable to the disturbance because the optical path length increases.

On the other hand, the surface shape measurement apparatus that utilizes the white interface light and uses a glass filter for light splitting requires a movable part in a part of the optical system and thus becomes complex. In addition, a method for making variable an oscillation wavelength of the laser also makes complex the surface shape measurement apparatus.

SUMMARY OF THE INVENTION

The present invention provides a surface shape measurement apparatus configured to precisely measure a surface shape of an object by a simple structure, and an exposure apparatus.

A surface shape measurement apparatus configured to measure a surface shape of an object to be measured. The surface shape measurement apparatus includes a light source configured to emit white light, a beam splitter configured to split the white light from the light source into two light beams, a first prism configured to increase an incident angle of one light beam that has been split by the beam splitter and directed to the object to be measured, the first prism having a first antireflection part that is formed at a period of a wavelength of the white light or smaller and has a moth-eye shape, a second prism configured to increase an incident angle of the other light beam that has been split by the beam splitter and directed to a reference surface of a reference optical element, the second prism having a second antireflection part that is formed at a period of a wavelength of the white light or smaller and has a moth-eye shape, a superimposition unit configured to superimpose object light as reflected light that contains information of a surface shape of the object and has passed the first prism with reference light as reflected light that contains information of a surface shape of a reference surface and has passed the second prism, and to generate white interference light, a Lyot filter configured to discretely separate the white interference light for each of a plurality of wavelengths, a photoelectric conversion element configured to photoelectrically convert the white interference light separated by the Lyot filter, and an operating unit configured to calculate a distribution of a power spectrum based on an output of the photoelectric conversion element, and to calculate the surface shape of the object to be measured by using information on a peak position of the power spectrum. An exposure apparatus having this surface shape measurement apparatus also constitutes one aspect of the present invention.

Further features of the present invention will become apparent from the following description of exemplary embodiments (with reference to the attached drawings).

BRIEF DESCRIPTION OF THE DRAWINGS

FIG. 3 is a perspective view of a relationship between the substrate and the object light in the surface shape measurement apparatus shown in FIG. 2 when it is viewed with a different angle.

FIG. 4A is a side view of a prism shown in FIG. 3. FIG. 4B is a partially enlarged view of FIG. 4A. FIG. 4C is a view showing a change of a refractive index. FIG. 4D is a side view of a variation of FIG. 4B.

FIG. 12 is a view of a conventional focus/tilt detection system.

FIG. 13 is a sectional view for explaining a problem in the focus/tilt detection system shown in FIG. 12.

DESCRIPTION OF THE EMBODIMENTS

Referring now to the accompanying drawings, a description will be given of embodiments of the present invention.

First Embodiment

Figure 1:
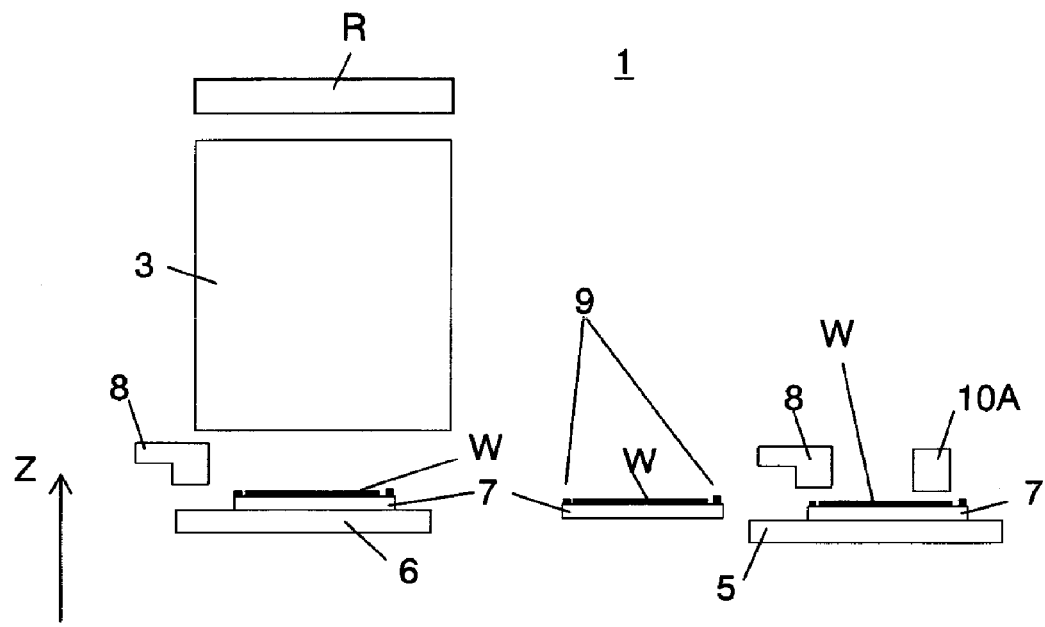
FIG. 1 is a sectional view of an exposure apparatus according a first embodiment.

Referring now to FIGS. 1 to 6, a description will be given of an exposure apparatus 1 according to a first embodiment. The exposure apparatus 1 is a scanning exposure apparatus configured to synchronously scan an original (mask or reticle) R and a substrate (wafer or liquid crystal substrate) W, and to expose an original's pattern onto the substrate W via a projection optical system 3. The projection optical system 3 projects a reduced image of the original's pattern onto the substrate. FIG. 1 omits an illumination apparatus (such as a light source and an illumination optical system) configured to illuminate the original.

In FIG. 1, the substrate W is transported between a measurement stage 5 and an exposure stage (substrate stage) 6 while the substrate W is absorbed by a chuck 7. On the exposure stage 6, the light from the original R led by the projection optical system 3 is projected onto the substrate W. Chuck marks 9 configured to measure a position of the substrate W are provided on the chuck 7. A three-dimensional positional relationship between the chuck marks 9 and the substrate W is measured by an alignment detection system 8 on the measurement stage 5. Thereafter, the chuck 7 is moved to the exposure stage 6 while absorbing the substrate W. On the exposure stage 6, three-dimensional positions of the chuck marks 9 are measured by the alignment detection system 8, and a three-dimensional position of the substrate W (in the XYZ directions) on the exposure stage 6 is recognized by using the measurement result and positional relationship information among the substrate W and the chuck marks 9. A surface shape measurement apparatus 10A is arranged around the measurement stage 5. The surface shape measurement apparatus 10A measures a surface shape of the substrate W that serves as an object to be measured. The exposure apparatus 1 includes a controller (not shown), and controls a position of the substrate W in a light-source direction (Z direction) of the projection optical system 3 by using the stage 6 in synchronously scanning the original R and the substrate W based on a measurement result of the surface shape measurement apparatus.

Figure 2:
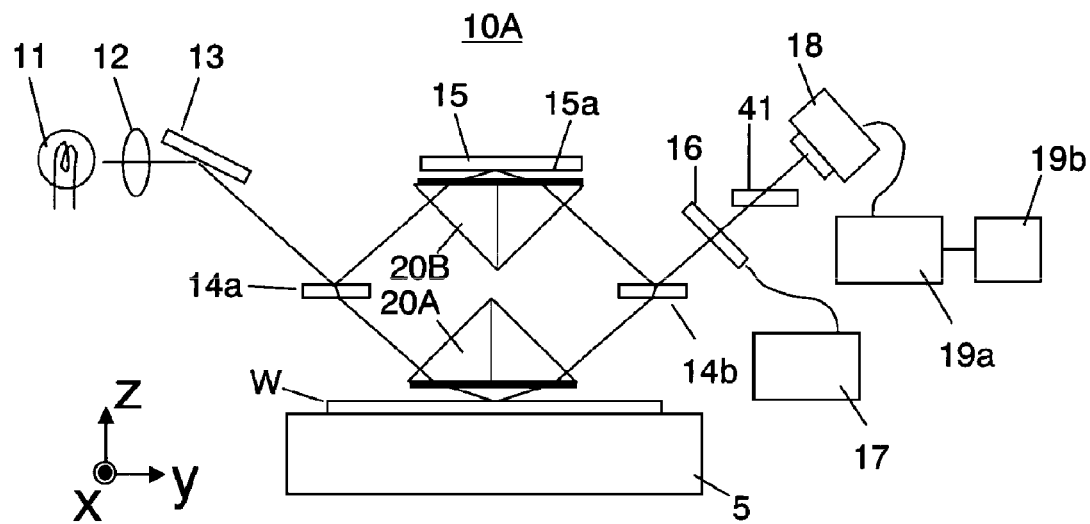
FIG. 2 is a sectional view of a surface shape measurement apparatus in the exposure apparatus shown in FIG. 1.

FIG. 2 is a sectional view of the surface shape measurement apparatus 10A. The surface shape measurement apparatus 10A includes a light source 11, a light-projecting optical system 12, a mirror 13, a pair of half-mirrors 14a and 14b, a pair of prisms 20A and 20B, an optical filter 16, a controller 17, an image sensor 18, a memory 19a, and an operating part 19b.

The light source 11 emits white light. The white light means light having a certain wavelength band, and does not mean light in white. The light source 11 can use a halogen lamp, a metal hydride lamp, a xenon lamp, etc. A resist on the substrate W is not resolved by the white light. Since the light source 11 of this embodiment does not use a wavelength variable laser, the surface shape measurement apparatus 10A has a simple structure.

The light-projecting optical system 12 converts the white light into a predetermined shape. The mirror 13 deflects the white light. The half-mirror 14a serves as a beam splitter configured to split the white light from the light source 11 into two light beams.

A (first) prism 20A increases an incident angle of one light beam that has been split by the half-mirror 14a and directed to the substrate W. The prism 20A has a (first) antireflection part that is formed at a period of a wavelength of the white light or smaller and has a moth-eye shape. The light that has transmitted through the half-mirror 14a is incident upon the prism 20A, and the light refracted on an exit surface of the prism 20A is obliquely incident upon the substrate W at an angle $\theta$ ($\theta \geqq 80°$). The "exit surface of the prism 20A" means a base part of the prism 20A having an isosceles triangle shape, as shown in FIG. 2. The incident angle $\theta$ is an angle of a ray from a height direction (Z direction) perpendicular to the surface of the substrate W.

FIG. 3 is a perspective view showing a relationship between the substrate W and the incident light in FIG. 2, and there is a broad illumination area A that can cover a plurality of shot areas on the substrate W. In FIG. 2, the light reflected on the substrate W again enters the prism 20A, exits to the outside of the prism 20A from the bevel side of the prism 20A, and reaches the half-mirror 14b.

The (second) prism 20B increases an incident angle of the other light beam that has been split by the half-mirror 14a and directed to a reference surface 15a of a reference optical element (reference mirror) 15. The prism 20B has a (second) antireflection part that is formed at a period of a wavelength of the white light or smaller and has a moth-eye shape. The prism 20B has the same structure as the prism 20A. In FIG. 2, the light reflected on the reference surface 15a again enters the prism 20B, exits to the outside of the prism 20B from the bevel side of the prism 20B, and reaches the half-mirror 14b.

The half-mirror 14b serves as a superimposition unit configured to superimpose object light (measuring light) as reflected light that contains information of a surface shape of the substrate W and has passed the prism 20A with reference light as reflected light that contains information of a surface shape of the reference surface 15a and has passed the prism 20B, and to generate white interference light.

The white interference light transmits the optical filter 16 that can select a wavelength, and enters the image sensor (detector) 18 via the light-receiving optical system 41.

The optical filter of this embodiment includes a Lyot filter configured to discretely separate the white interference light for each of a plurality of wavelengths. The Lyot filter is a filter configured to transmit only light having a specific wavelength. The Lyot filter has a structure that arranges a crystalline plate, such as a quartz plate, which has a thickness of 2nd (n=0, 1, 2, . . . ) and an optical axis parallel to the end surface among a plurality of polarizers that have parallel oscillation directions of transmitting linearly polarized light so that the optical axis forms 45° relative to the oscillation direction of the polarizer. When the measurement stage 5 drives the substrate W in a (Z) direction perpendicular to the surface of the substrate W, the optical filter 16 discretely separates the white interference light into a plurality of wavelengths. This embodiment thus uses the inherent measurement stage 5 as a movable part rather than using a glass filter so as to separate the white interference light into a plurality of interference light beams each having a single wavelength. It is thus unnecessary to provide a movable part at a part in the optical system, and the surface shape measurement apparatus 10A has a simple structure.

The image sensor 18 includes a CCD, and serves as a photoelectric conversion element configured to photoelectrically convert the white interference light separated by the optical filter 16.

The photoelectrically converted signal output from the image sensor 18 is an interference signal having information on the surface shape of the substrate W, and stored in the memory 19$a$. The operating part 19$b$ calculates a power spectrum based on the data stored in the memory 19$a$, and calculates the surface shape of the substrate W by using information on a peak position of the power spectrum.

A description will be given of the prism 20A. As described above, the prism 20B has the same structure as the prism 20A, and a description thereof will be omitted. FIG. 4A is a side view of the prism 20A, and FIG. 4B is an enlarged view of an A part of FIG. 4A. An antireflection part 22A having a refractive index equal or equivalent to a refractive index N of the glass that constitutes the prism 20A is added to the base part of the prism 20A. The three-dimensional shape of the antireflection part 22A has a moth-eye shape in the order of a wavelength of the measuring light or smaller. The moth-eye shape is a structure having a regular projection arrangement in the order of several hundred nanometers on its surface, and the following equation is met between a period P of vertexes of the fine relief pattern and the wavelength $\lambda$ of the measuring light:

$$P \leq \lambda \quad \text{EQUATION 1}$$

The fine relief pattern provided on the surface of an article can convert an abrupt and discontinuous refractive index change into a continuous and gradually changing refractive index change, as shown in FIG. 4C, and thus the light reflections decrease on the base part of the prism 20A. In particular, the antireflection part 22A is optimized to the light that exits from the base of the prism 20A at 80° or larger or the object light incident upon the base of the prism 20A at 80° or larger. The antireflection part 22A so shaped that a plurality of conical projections 23A are densely arranged without apertures on the XY plane, as shown in FIG. 4B. In another embodiment, the antireflection part 22B includes a plurality of truncated cone projections 23B arranged with intervals S on the XY plane, as shown in FIG. 4D. Assume that the light having a light quantity of a transmittance of 60% or higher can be obtained for the light with $\lambda$ of about 780 nm, where P=500 nm, S=330 nm, h=430 nm, t=100 nm in FIG. 4D.

A description will now be given of a method for calculating the surface shape of the substrate W through the operating part 19B based on the interference signal detected by the image sensor 18. In FIG. 2, in the white light emitted from the light source 11, light having a certain specific wavelength is addressed. Assumed that the object light derived from that light having the certain specific wavelength via the substrate W has an intensity of $i_O$, the reference light derived from that light having the certain specific wavelength via the reference surface 15$a$ has an intensity of $i_R$, and a position of the measuring point P shown in FIG. 3 is P(x', y'). Then, the intensity of the interference signal at the measuring point P can be expressed by Equation 2. Here, H(x', y') is a distance from the reference surface of the point P(x', y') on the substrate W and is given by $2\pi/\lambda$.

$$i(x',y',k) = i_R + i_O + 2\sqrt{i_R \times i_O} \cos(2 \, kH(x',y')) \quad \text{EQUATION 2}$$

Referring back to FIG. 2, the image sensor 18 detects an interference signal of a plurality of interference light beams each having a single wavelength, separated by the optical filter 16, and derived from the white interference signal that is generated after the half-mirror 14$b$. When a wavelength of the interference light to be photoelectrically detected is discretely changed, a time series of interference signals i(n$\Delta$t) at one point on the measuring plane, such as the measuring point P in FIG. 3, is expressed by a periodic function having a period of an inverse of H. When the time series of interference signal i(t) is FFT-converted, a peak value in the resultant power spectrum varies according to the height of the measuring point. When it is assumed that $f_{peak}$ denotes a frequency having a peak value in the power spectrum, an absolute height H at the measuring point P can be calculated by Equation 3, where a minimum resolution $\Delta h$ is a numerical value that is determined by a wavelength changing width by the optical filter 16.

$$H = \frac{\pi}{\Delta k} f_{peak} = \Delta h \cdot f_{peak} \quad \text{EQUATION 3}$$

Figure 5:
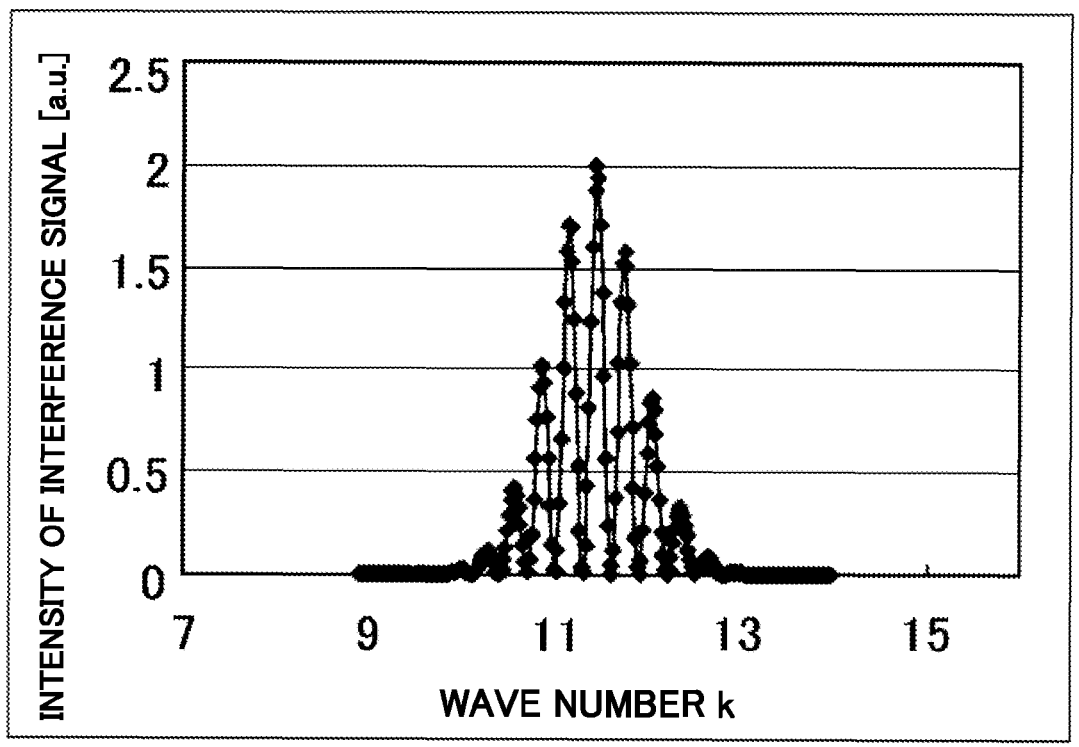
FIG. 5 is a view showing a result of height measurements of a measurement point shown in FIG. 3.
Figure 6:
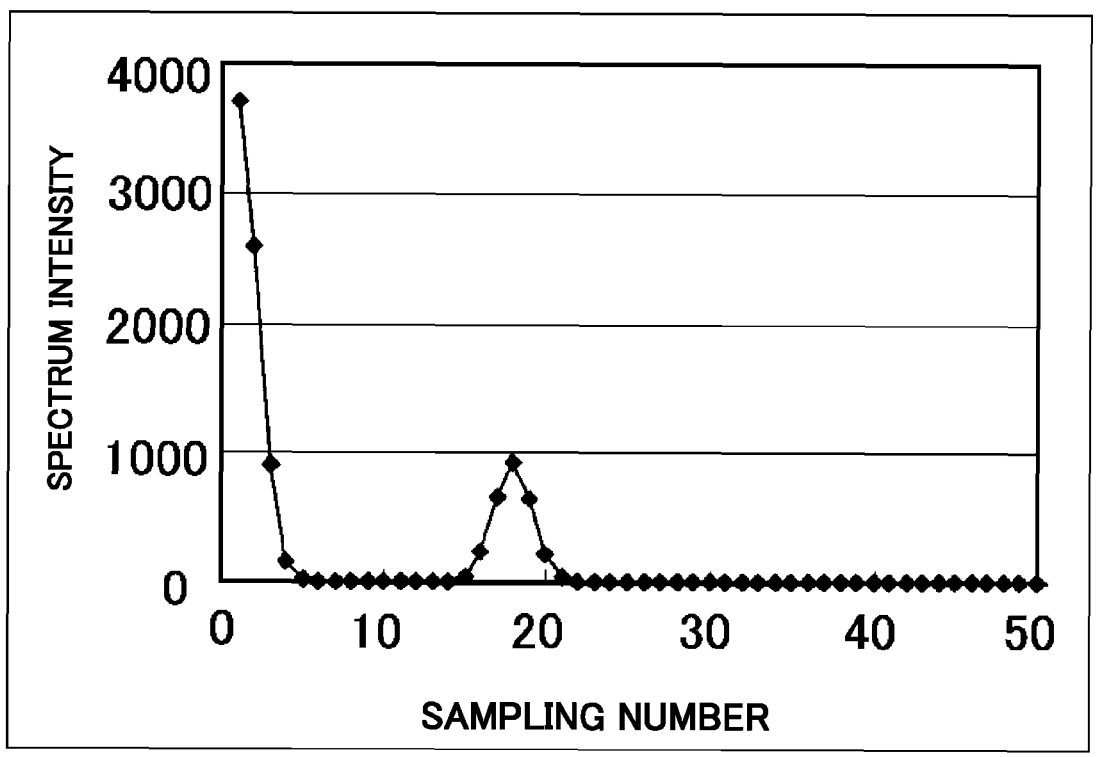
FIG. 6 is a view showing a result of height measurements of a measurement point shown in FIG. 3.

FIGS. 5 and 6 show results of height measurements at the measuring point P calculated in accordance with the above method. FIG. 5 is an intensity of the interference signal at the position of P which is obtained for each step when a wave number k expressed by Equation 4 is changed every 0.02 steps in a range from 8.874 to 13.974 (which corresponds to 0.708 μm to 0.450 μm when converted into a change of $\lambda$).

$$k = 2\pi/\lambda \quad \text{EQUATION 4}$$

A means for changing a value of k uses the optical filter 16, and the controller 17 can arbitrarily set a maximum value, a minimum value, and a step amount (a wavelength changing width) of k, etc.

FIG. 6 is a graph showing a spectrum distribution obtained through the FFT for the intensity of the interference signal to a wave number change at a position of the point P. In FIG. 6, a value of k when the spectrum becomes maximum is obtained from the Gaussian curve method. Assume that the value is $k_{Max}$=16.900. Then, the resolution $\Delta h$ of the surface shape in the height direction is calculated from Equation 5, by using a step amount $\Delta k$ of k, an incident angle $\theta$ of the object light upon the substrate W, and a sampling number Sn of the FFT:

$$\Delta h = 2\pi/(\Delta k \times Sn)/2/\cos\theta \quad \text{EQUATION 5}$$

The following equation provides a result that the measuring point P in FIG. 3 has a height $H_P$ of 58.72 μm, where $\Delta k$=0.02, $\theta$=80°, and Sn=256. In Equation 6, $k_{max}$ corresponds to k determined by the wavelength $\lambda$ that provides a peak in Equation 4:

$$Hp = \Delta h \times k_{Max} \quad \text{EQUATION 6}$$

A result of the above height measurement is derived from the measuring point P shown in FIG. 3, but a height measurement in the two-dimensional area is available when the height is measured at another arbitrary point other than the measuring point P. While this embodiment arranges the optical filter 16 in the optical path after the object light is reflected on the substrate W as a reflection surface and the reference light is reflected on the reference surface 15$a$ as a reflection surface, the position of the optical filter 16 is not limited. For example, the optical filter 16 may be installed in the optical path before the object light and the reference light reach the corresponding reflection surfaces, for example, in the optical path between the mirror 13 and the half-mirror 14$a$.

Thus, the operating part 19$b$ calculates the power spectrum distribution, selects a wavelength that gives a peak at a specific position, and calculates the surface shape of the substrate W by using Equation 6. Since the wavelength given by the optical filter 16 is discrete, the operating part 19b of this embodiment interpolates the in-betweens among the discrete measurement points.

Second Embodiment

Referring now to FIGS. 7 to 11, a description will be given of a second embodiment. This embodiment can also commonly use the exposure apparatus 1 shown in FIG. 1, but this embodiment uses a surface shape measurement apparatus 10B rather than the surface shape measurement apparatus 10A. The surface shape measurement apparatus 10B is different from the surface shape measurement apparatus 10A in further including a multi-cantilever unit 30.

The multi-cantilever unit 30 includes a plate holder 31 and a plurality of cantilevers 35, and is provided between the prism 20A and the substrate W.

The holder 31 has a plurality of rectangular-parallelepiped holes 32 as shown by a dotted line at parts corresponding to an optical path of one light beam split by the half-mirror 14a.

A plurality of cantilevers 35 each has a base 36 that is cantilevered to a bottom surface 31a of the holder 31 at an attachment part 36a, and a measurement probe 37 that is fixed onto the base 36 and can contact a surface of the substrate W. The measurement probe 37 is attached to a tip of the base 36 that is an end opposite to the attachment part 36a. The measurement probe 37 has a conical shape in this embodiment, and is attached to the base 36 (at its bottom circle) so that the top of the cone faces the bottom. In this embodiment, the object light is light reflected from a back surface 36b of the base 36 of the cantilever 35. A reflecting position 36c on the back surface 36b is an approximately center of the back surface 36b of the base 36, but a part to be measured is a head position 36d at a backside of the part to which the measurement probe 37 is attached as the head part on the back surface 36b. Therefore, the operating part 19b of this embodiment provides a calibration to convert the actual reflecting position 36c into the head position 36d.

Figure 7:
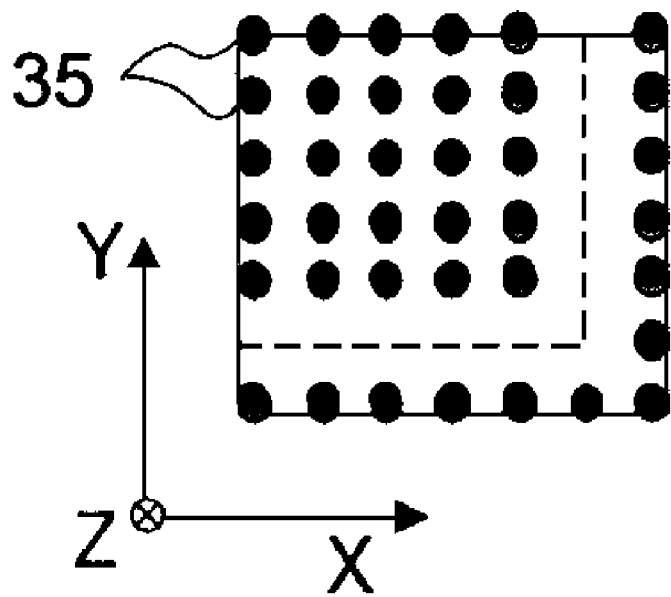
FIG. 7 is a view showing an arrangement of cantilevers in a surface shape measurement apparatus according to a second embodiment.

FIG. 7 shows an illustrative arrangement of a plurality of cantilevers 35 of the multi-cantilever unit 30, which for example, arranges 36 cantilevers 35 on a square area having one side of 35 mm at intervals of 1 mm longitudinally and laterally, totally 1,296 cantilevers. This embodiment refers to a member that arranges a plurality of cantilevers 35 as a multi-cantilever. In FIG. 7, a plurality of cantilevers 35 is two-dimensionally arranged but may be one-dimensionally arranged.

The cantilever 35 is used for a commercially available atomic force microscope ("AFM"), and utilizes an atomic force (van der Waals force) that operates between an object to be measured and the cantilever 35, and measures a position of the object in the Z direction (perpendicular to the paper plane).

A conventional focus/tilt detection system 100 shown in FIG. 12A illuminates multiple marks 102 with obliquely incident illumination light (a plurality of light beams) L, and a light-projecting optical system 104 projects the light derived from the multiple marks 102 onto the substrate surface, and a light-receiving optical system 106 receives the reflected light. The illumination light L is incident upon the substrate surface (more precisely a surface of the resist applied onto the substrate) at a highly incident angle, the reflected light is scanned by a galvano mirror 108, and a detector 112 photoelectrically converts the light that has transmitted a slit 110. A signal of an output of the detector 112 is processed, and the substrate W is driven under the focus control in the optical-axis direction as shown by an arrow so that the defocus signal can be the best focus signal, as shown in FIG. 12B. In addition, a tilt of the substrate surface to be exposed is calculated from the height measurement information of different positions.

As shown in FIG. 13, near a peripheral circuit pattern and a scribe line, a step of a resist RS surface is smaller than a depth of focus ("DOF"), but too large for the focus measurement, causing a measurement result having a significant error. This error is caused by a shift from a regular reflection angle due to a refraction influenced by the multiple reflections in the resist or influenced by the resist's surface shape of the measuring light that is used for the focus detection system and has reflected on the substrate. The reflective index differs in accordance with a density of an IC pattern. Therefore, the focus/tilt detection system 100 prevents this offset by mitigating a signal distortion by setting an angle of the illumination light L to 80° or larger, but instead a light deflection part in the optical system becomes complex and large, and a long optical path is vulnerable to the disturbance.

This embodiment utilizes the atomic force, prevents the optical offset, and precisely measures a surface shape of the resist applied onto the substrate (or a change of the surface height).

Figure 8:
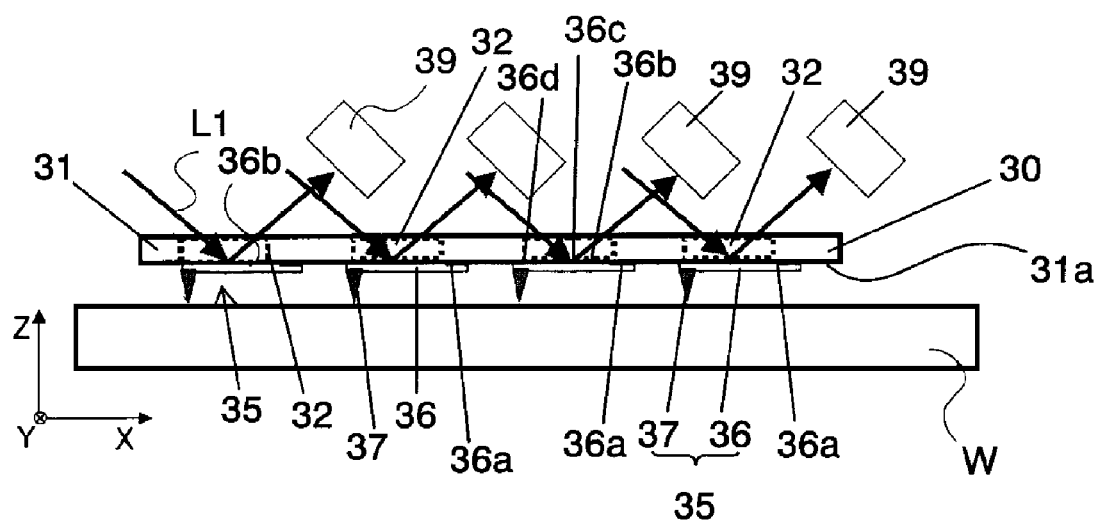
FIG. 8 is a side view showing that a plurality of cantilevers measures a surface of a substrate.

FIG. 8 is a side view showing that a plurality of cantilevers 35 measures the substrate surface. A measurement system of the cantilever 35 is referred to as an optical lever system, and the cantilever 35 moves up and down in accordance with a height position on the substrate W surface due to the atomic force that operates between the measurement probe 37 and the substrate W surface. The height of the cantilever 35 or the surface shape of the substrate W is measured by introducing the obliquely incident light L1 onto the back surface 36b of the base 36 of the cantilever 35, and by detecting the light reflected from the back surface 36b of the cantilever 35 using a photo detector 39, such as a CCD.

Figure 9:
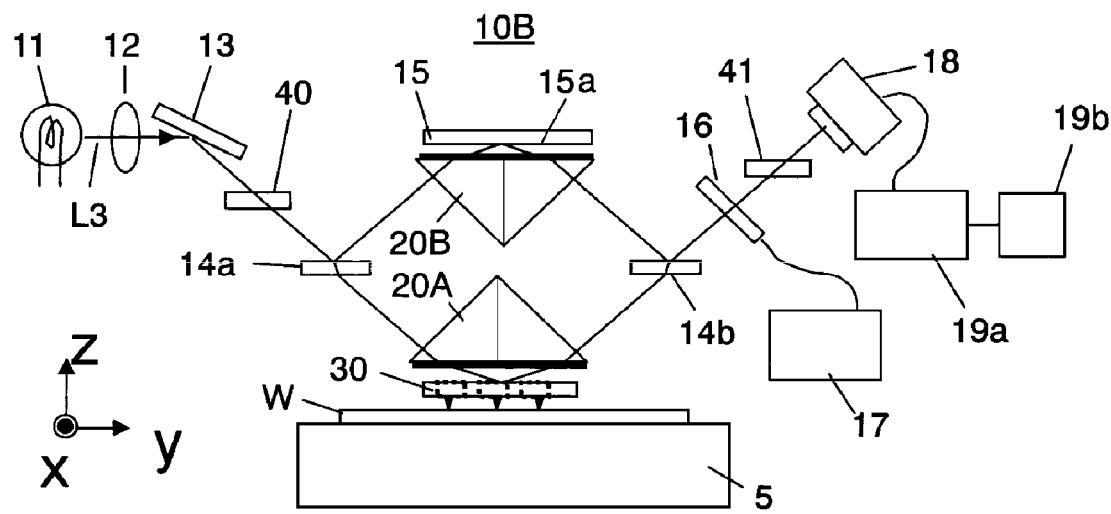
FIG. 9 is a sectional view of the surface shape measurement apparatus according to the second embodiment.

FIG. 9 is a sectional view of the surface shape measurement apparatus 10B having the multi-cantilever unit 30. Measuring light L3 emitted from the light source 11 is converted into a predetermined shape by the light-projecting optical system 12, deflected by the mirror 13, split by a multi-spot generator 40, and split by the half-mirror 14b into two optical paths of the object light and the reference light in the two directions. The object light that has transmitted the half-mirror 14a transmits the prism 20A, and is incident as the obliquely incident light L1 upon the back surface 36b of the multi-cantilever unit 30. The prism 20A has an antireflection part 22A, and when the light transmits through the base part of the prism 20A, even at a high incident or exit angle of 80° or larger, the light can be irradiated onto the back surface 36b of each cantilever 35 without a loss of the light quantity.

The light reflected from the back surface 36b of the cantilever 35 transmits through the half-mirror 14b and the optical filter 16, and is led to the light-receiving surface of the image sensor 18 through the light-receiving optical system 41. On the other hand, the other light beam split by the half-mirror 14a transmits the prism 20B, and is irradiated onto the reference surface 15a at a highly obliquely incident angle of 80° or larger. The reflected light is reflected on the half-mirror 14b, and led to the light receiving surface of the image sensor 18 via the optical filter 16 and the light-receiving optical system 41. While the commercially available AFM uses a quadrisection sensor as a photo detector, this embodiment uses a two-dimensional image sensor, such as an area type CCD.

Since the height position (in the Z direction) of the back surface 36b of the cantilever 35 changes in accordance with the height of the substrate W, a surface shape of the substrate W can be measured by measuring the height of each cantilever 35 by a method described in the first embodiment. For example, now one cantilever 35 is addressed. The object light irradiated onto the back surface 36b of the cantilever 35 at a highly obliquely incident angle of 80° or larger and the reference light incident upon the reference surface 15a at a highly obliquely incident angle are superimposed on an element subsequent to the half-mirror 14b, and the white interference light is generated. The white interference light is separated into a plurality of interference light beams each having a single wavelength in time series using the optical filter 16 and photoelectrically converted, and the interference signal for each wavelength is stored in the memory 19a. The operating part 19b performs the FFT for the plurality of interference signals, and calculates a wave number $k_{Max}$ having a peak position of the power spectrum ($=2\pi/\lambda n$ where n is a sampling number). A height change of the back surface 36b of the cantilever 35 can be calculated from a value of the resolution in the height direction calculated based on the wave number $k_{Max}$ and Equations 5 and 6, or the surface shape of the substrate W can be recognized.

Figure 10:
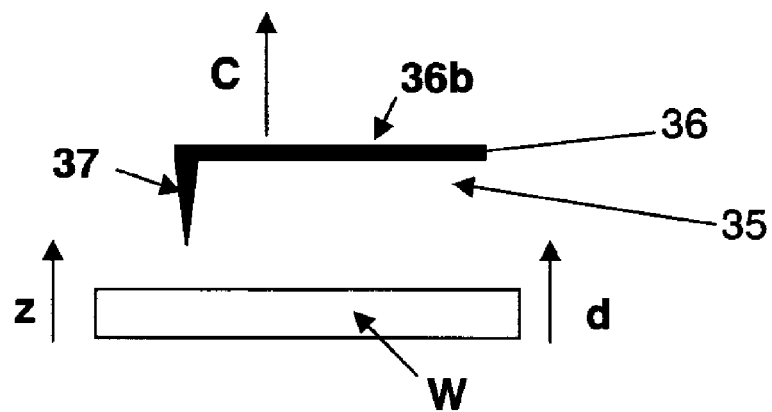
FIG. 10 is a sectional view of the cantilever of the surface shape measurement apparatus shown in FIG. 9.
Figure 11:
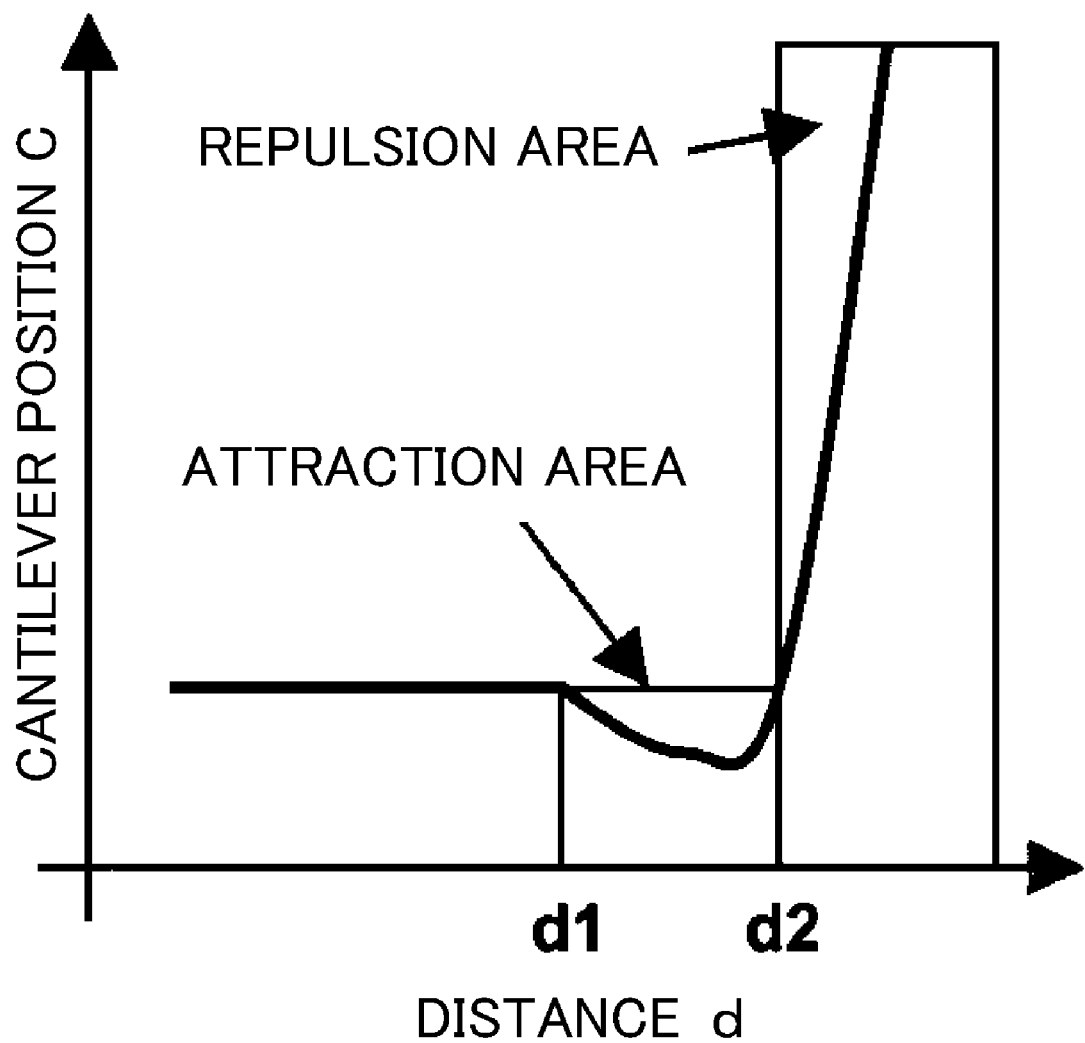
FIG. 11 is a graph showing a relationship among a distance between the cantilever and the substrate, and a position of the cantilever.

Referring now to FIGS. 10 and 11, a description will be given of a principle of a surface shape measurement of the substrate W by using the cantilever 35. When it is assumed, as shown in FIG. 10, that a position C is a position of the cantilever 35 in the Z direction on the basis of a certain arbitrary position (such as a position of the back surface 36b of the cantilever 35), and a position d is a surface position of the measurement point of the substrate W, then they have a relationship as shown in FIG. 11. FIG. 11 is a graph (force curve) showing a relationship between the position C of the cantilever 35 and the surface position d of the substrate W when the substrate W is gradually moved closer to the cantilever 35 that is held at the position C. In FIG. 10, the Z direction (the upper direction in FIG. 10) is a positive direction.

When the cantilever 35 is sufficiently distant from the substrate W, the position C of the cantilever 35 does not change even when the substrate W is moved closer to the cantilever 35. When it is moved closer to some extent and the surface position of the substrate W becomes a position d1 (where a distance between the probe 37 of the cantilever 35 and the surface of the substrate W is a predetermined distance), an atomic force operates between them and they are attracted to each other. Then, when the substrate W is moved closer to the cantilever 35, the cantilever 35 is attracted to the substrate surface due to the attractive force, and a value of the position C of the cantilever 35 gradually decreases (in an attraction area). When the substrate W is moved closer to the cantilever 35 and the surface position of the substrate W becomes a position d2, they, in turn, repel each other due to the atomic force. When the substrate W is moved much closer to the cantilever 35, the cantilever 35 is separating from the substrate surface due to the repulsive force and a value of the position C of the cantilever 35 abruptly increases (in a repulsion area). This embodiment utilizes the repulsion characteristic in the repulsion area, and arranges the cantilever 35 and the substrate W so that the distance between them can be within the distance d2. Of course, the attraction characteristic in the attraction area can be utilized, but the substrate W may have a plurality of positions for the position C of one cantilever 35 in the attraction area. Hence, it is necessary to recognize that a position of the substrate W cannot always be uniquely determined from the position of the cantilever 35. In setting a distance between the cantilever 35 and the substrate W, it is necessary to consider height scattering of the surface shape of the substrate W. This is because when a distance between the cantilever 35 and the substrate W is smaller than a value of the height scattering of the surface shape of the substrate W, the probe 37 of the cantilever 35 is likely to contact the substrate surface.

The second embodiment combines a non-optical measurement with an optical measurement by using the multi-cantilever unit 30. Therefore, this embodiment can provide a highly precise measurement in the nanometer order because it generates no offsets, which would otherwise occur in measuring the surface shape of the resist applied onto the substrate only by the optical method.

The above surface shape measurement apparatuses 10A and 10B each has a simple and small structure, and can provide an optical system that is less subject to a loss of light quantity even for highly obliquely incident light. An optical system configured to select a wavelength contributes to a simplification of the movable part. Due to the above effects, they are less subject to measurement errors caused by the resist applied onto the substrate surface, can achieve a high focus correction precision to a smaller DOF, and can improve a yield per one substrate.

A device manufacturing method of this embodiment is performed as follows: A device (such as a semiconductor integrated circuit device and a liquid crystal display device) can be manufactured by the step of exposing a photosensitive agent applied substrate (such as a wafer and a glass plate) using the exposure apparatus of one of the above embodiments, the step of developing the substrate, and another well-known step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-129231, filed May 16, 2008, which is hereby incorporated by reference herein in its entirety.

What is claimed is:

1. A surface shape measurement apparatus configured to measure a surface shape of an object to be measured, the surface shape measurement apparatus comprising:
    a light source configured to emit white light;
    a beam splitter configured to split the white light from the light source into two light beams;
    a first prism configured to increase an incident angle of one light beam that has been split by the beam splitter and directed to the object to be measured, the first prism having a first antireflection part that is formed at a period of a wavelength of the white light or smaller and has a moth-eye shape;
    a second prism configured to increase an incident angle of the other light beam that has been split by the beam splitter and directed to a reference surface of a reference optical element, the second prism having a second antireflection part that is formed at a period of a wavelength of the white light or smaller and has a moth-eye shape;
    a superimposition unit configured to superimpose object light as reflected light that contains information of a surface shape of the object and has passed the first prism with reference light as reflected light that contains information of a surface shape of a reference surface and has passed the second prism, and to generate white interference light;
    a Lyot filter configured to discretely separate the white interference light for each of a plurality of wavelengths;
    a photoelectric conversion element configured to photoelectrically convert the white interference light separated by the Lyot filter; and
    an operating unit configured to calculate a distribution of a power spectrum based on an output of the photoelectric conversion element, and to calculate the surface shape of the object to be measured by using information on a peak position of the power spectrum.

2. The surface shape measurement apparatus according to claim 1, further comprising a stage configured to move the object to be measured in a direction perpendicular to a surface of the object, the Lyot filter discretely separating the white interference light for each of the plurality of wavelengths, when the stage drives the object in the direction.

3. The surface shape measurement apparatus according to claim 1, wherein the Lyot filter is arranged between the superimposition unit and the photoelectric conversion element.

4. The surface shape measurement apparatus according to claim 1, wherein the Lyot filter is arranged between the light source and the beam splitter.

5. The surface shape measurement apparatus according to claim 1, further comprising a multi-cantilever unit provided between the first prism and the object to be measured,
wherein the multi-cantilever includes:
a holder having a hole at a part corresponding to an optical path of the one light beam; and
a plurality of cantilevers each having a base cantilevered by the holder, and a measurement probe that is fixed onto the base and can contact the object to be measured, and
wherein the object light is light reflected from the base of the cantilever.

6. The surface shape measurement apparatus according to claim 1, further comprising a controller configured to set a minimum value of each wavelength separated by the Lyot filter, a maximum value of each wavelength, and a changing width of each wavelength.

7. An exposure apparatus configured to expose a pattern of an original onto a substrate by synchronously scanning the original and the substrate, the exposure apparatus comprising:
a surface shape measurement apparatus configured to measure a surface shape of the substrate as an object to be measured; and
a substrate stage configured to adjust a position of the substrate based on a measurement result of the surface shape measurement apparatus, in synchronously scanning the original and the substrate,
wherein the surface shape measurement apparatus includes:
a light source configured to emit white light;
a beam splitter configured to split the white light from the light source into two light beams;
a first prism configured to increase an incident angle of one light beam that has been split by the beam splitter and directed to the object to be measured, the first prism having a first antireflection part that is formed at a period of a wavelength of the white light or smaller and has a moth-eye shape;
a second prism configured to increase an incident angle of the other light beam that has been split by the beam splitter and directed to a reference surface of a reference optical element, the second prism having a second antireflection part that is formed at a period of a wavelength of the white light or smaller and has a moth-eye shape;
a superimposition unit configured to superimpose object light as reflected light that contains information of a surface shape of the object and has passed the first prism with reference light as reflected light that contains information of a surface shape of a reference surface and has passed the second prism, and to generate white interference light;
a Lyot filter configured to discretely separate the white interference light for each of a plurality of wavelengths;
a photoelectric conversion element configured to photoelectrically convert the white interference light separated by the Lyot filter; and
an operating unit configured to calculate a distribution of a power spectrum based on an output of the photoelectric conversion element, and to calculate the surface shape of the object to be measured by using information on a peak position of the power spectrum.

8. A device manufacturing method comprising the steps of:
exposing a substrate using an exposure apparatus; and
developing the substrate that has been exposed,
wherein the exposure apparatus is configured to expose a pattern of an original onto the substrate by synchronously scanning the original and the substrate,
wherein the exposure apparatus includes:
a surface shape measurement apparatus configured to measure a surface shape of the substrate as an object to be measured; and
a substrate stage configured to adjust a position of the substrate based on a measurement result of the surface shape measurement apparatus, in synchronously scanning the original and the substrate,
wherein the surface shape measurement apparatus includes:
a light source configured to emit white light;
a beam splitter configured to split the white light from the light source into two light beams;
a first prism configured to increase an incident angle of one light beam that has been split by the beam splitter and directed to the object to be measured, the first prism having a first antireflection part that is formed at a period of a wavelength of the white light or smaller and has a moth-eye shape;
a second prism configured to increase an incident angle of the other light beam that has been split by the beam splitter and directed to a reference surface of a reference optical element, the second prism having a second antireflection part that is formed at a period of a wavelength of the white light or smaller and has a moth-eye shape;
a superimposition unit configured to superimpose object light as reflected light that contains information of a surface shape of the object and has passed the first prism with reference light as reflected light that contains information of a surface shape of a reference surface and has passed the second prism, and to generate white interference light;
a Lyot filter configured to discretely separate the white interference light for each of a plurality of wavelengths;
a photoelectric conversion element configured to photoelectrically convert the white interference light separated by the Lyot filter; and
an operating unit configured to calculate a distribution of a power spectrum based on an output of the photoelectric conversion element, and to calculate the surface shape of the object to be measured by using information on a peak position of the power spectrum.

* * * * *